(12) United States Patent
Kahng et al.

(10) Patent No.: US 7,149,999 B2
(45) Date of Patent: Dec. 12, 2006

(54) METHOD FOR CORRECTING A MASK DESIGN LAYOUT

(75) Inventors: Andrew B. Kahng, Delmar, CA (US); Puneet Gupta, La Jolla, CA (US); Dennis Sylvester, Ann Arbor, MI (US); Jie Yang, Ann Arbor, MI (US)

(73) Assignees: The Regents of the University of California, Oakland, CA (US); The Regents of the University of Michigan, Ann Arbor, MI (US)

( * ) Notice: Subject to any disclaimer, the term of this patent is extended or adjusted under 35 U.S.C. 154(b) by 187 days.

(21) Appl. No.: 10/787,070

(22) Filed: Feb. 25, 2004

(65) Prior Publication Data

US 2004/0237061 A1 Nov. 25, 2004

Related U.S. Application Data

(60) Provisional application No. 60/450,051, filed on Feb. 25, 2003.

(51) Int. Cl.
*G06F 17/50* (2006.01)

(52) U.S. Cl. .................................... 716/19; 716/21

(58) Field of Classification Search ................ 716/21, 716/19
See application file for complete search history.

(56) References Cited

U.S. PATENT DOCUMENTS 6,567,972 B1* 5/2003 Tanaka et al. ................ 716/21

2002/0073394 A1* 6/2002 Milor et al. .................. 716/19
2005/0216877 A1* 9/2005 Pack et al. .................... 716/19

OTHER PUBLICATIONS

International Technology Roadmap for Semiconductors, Dec. 2001 http://public.itrs.net/.
Y. Cao., P. Gupta, A.B. Kahng, D. Sylvester and J. Yang, "Design Sensitivities to Variability: Extrapolations and Assessments in Nanometer VLSI", *IEEE International ASIC/SOC Conference*, 2002, pp. 411-415.
"The Outlook for Semiconductor Processes and Manufacturing Technologies in the 0.1-μm Age", (2001) http:/www.cyberfab.net/events/013mmts/links013.html.
M.L. Rieger, J.P. Mayhew and S. Panchapakesan, "Layout Design Methodologies for Sub-Wavelength Manufacturing", *Proceedings of Design Automation Conference*, 2001, pp. 85-92.
Chiang Yang, "Challenges of Mask Cost and Cycle Time", *SEMATECH: Mask Supply Workshop, Intel*, 2001.
W. Carpenter, "International SEMATECH" A Focus on the Photomask Industry (2000) http://www.kla-tencor.com/company_info/magazine /autumn00/ Inter_SEMATECH_photomaskindustry_AutumnMag00-3.pdf.

(Continued)

*Primary Examiner*—Sun James Lin
(74) *Attorney, Agent, or Firm*—Greer, Burns & Crain, Ltd.

(57) ABSTRACT

A method for performing a mask design layout resolution enhancement includes determining a level of correction for a mask design layout for a predetermined parametric yield with a minimum total correction cost. The mask design layout is corrected at a determined level of correction based on a correction algorithm if the correction is required. In this manner, only those printed features on the mask design layout that are critical for obtaining a desired performance yield are corrected, thereby reducing total cost of correction of the mask design layout.

37 Claims, 3 Drawing Sheets

OTHER PUBLICATIONS

B. Bruggeman et al., "Microlithography Cost Analysis", *Interface Symposium*, 1999.

S. Murphy, Dupont Photomask, *SEMATECH: Mask Supply Workshop*, 2001.

A. Agarwal, D. Blaauw and V. Zolotov; "Statistical Timing Analysis Using Bounds and Selective Enumeration", *ACM/IEEE International Workshop on Timing Issues in the Specification and Synthesis of digital Systems*, 2002, pp. 1243-1260.

Robert R. Kinnison, *Applied Extreme Value Statistics*, Battelle Press, 1985.

W. Chuang, S.S. Sapatnekar and I.N. Hajj, "Delay and Area Optimization for Discrete Gate Sizes under Double-Sided Timing Constraints", *Proc. IEEE Custom Integrated Circuits Conference*, 1993, pp. 9.4.1-9.4.4.

R. Nair, C.L. Berman, P.S. Hauge and E.J. Yoffa, "Generation of Performance COnstraints for Layout" *IEEE Transactions on Computer Aided Design*, 8(8), 1989, pp. 860-874.

A.E. Dunlop, J.P. Fishburn, D.D. Hill and D.D. Shugard, "Experiments using Automatic Physical Design Techniques for Optimizing Circuit Performance", *Proc. IEEE International Symposium on Circuits and Systems*, (2), 1990, pp. 847-851.

M. Sarrafzadeh, D.A. Knol and G.E. Tellez, "A Delay Budgeting Algorithm Ensuring Maximum Flexibility in Placement", *IEEE Transactions on Computer Aided Design of Integrated circuits and Systems*, 16(11), 1997, pp. 1332-1341.

Synopsis Design Compiler, http://www.synopsys.com/products/logic.html.

\* cited by examiner

| GATE SIZING PROBLEM | MINIMUM COST OF CORRECTION PROBLEM |
|---|---|
| AREA | COST OF CORRECTION |
| NOMINAL DELAY | DELAY $\mu$+ksigma |
| CYCLE TIME | SELLING POINT DELAY |
| DIE AREA | TOTAL COST OF RET |

FIG. 3

METHOD FOR CORRECTING A MASK DESIGN LAYOUT

This Application claims the benefit of U.S. Provisional Application No. 60/450,051, filed Feb. 25, 2003.

FIELD OF THE INVENTION

The present invention is in the fields of optical lithography and integrated circuit fabrication.

BACKGROUND OF THE INVENTION

Consistent improvements in the resolution of optical lithography techniques have been a key enabler for continuation of Moore's Law. However, as minimum printed feature sizes continue to shrink, the wavelength of light used in modern lithography systems is no longer several times larger than the minimum line dimensions to be printed, e.g., today's 130 nm CMOS processes use 193 nm exposure tools. As a result, modem CMOS processes, for example, are operating in a sub-wavelength lithography regime. The International Technology Roadmap for Semiconductors (ITRS) offers projections on the requirements of next generation lithography systems and states that achieving aggressive microprocessor (MPU) gate lengths and highly controllable gate CD control are two key issues.

To meet these requirements, resolution enhancement techniques (RETs) such as optical proximity correction (OPC) and phase shift mask (PSM) technology are applied to mask design layouts. Advanced mask manufacturing technologies, such as high-precision electron beam machines, high numerical aperture exposure equipment, high-resolution resists, and extreme ultraviolet and possibly electron-beam projection lithography, could also play roles in continued lithography scaling. The result of each of these approaches is a large increase in mask costs.

In the current design-manufacturing interface, no concept of function is injected into the mask flow, i.e., current RETs are oblivious to design intent. Mask writers today work equally hard in perfecting a dummy fill shape, a piece of the company logo, a gate in a critical path, and a gate in a non-critical path, for example. Errors in any of these shapes will trigger rejection of the mask in the inspection tool. The result is unduly low mask throughput and high mask costs.

SUMMARY OF THE INVENTION

A method for performing a mask design layout resolution enhancement includes determining a level of correction for the design layout for a predetermined parametric yield with a minimum total correction cost. The design layout is corrected at the determined level of correction based on a correction algorithm if the correction is required. In this manner, only those printed features on the design layout that are critical for obtaining the desired performance yield are corrected, thereby reducing the total cost of correction of the design layout.

BRIEF DESCRIPTION OF THE DRAWINGS

FIG. 3 is a table illustrating a method for performing a correction algorithm in accordance with one embodiment of the present invention.

DETAILED DESCRIPTION OF THE PREFERRED EMBODIMENTS

The present invention concerns reducing mask costs through process means. In accordance with one embodiment, the invention involves the use of various levels (e.g., moderate to aggressive) of resolution enhancement techniques (RETs), such as optical proximity correction (OPC), phase-shift masks (PSM) and sub-resolution assist features (SRAFs), for example, to limit mask complexity.

Many printed features in the layout of the mask design are not timing-critical and a larger degree of process variation may be tolerable for them. At the same time, a certain minimum level of process correction is required to ensure printability of the layout. Forward-annotating the design's functional information will permit less total correction to meet the parametric yield requirements. Less aggressive use of RET translates to lowered costs through reduced figure counts, shorter mask write times and higher mask yields.

In the present application, a "selling point" is defined as the circuit delay which gives a predetermined parametric yield. For example, 99% parametric yield means that 99% of parts would be expected to run at the target frequency or higher. Given the range of allowable corrections for each feature in the mask design layout as well as the cost and parameter variances associated with each correction level, one embodiment of the present invention determines the level of correction for each feature such that the prescribed selling point delay is attained with minimum total correction cost. In other words, the present invention solves the "minimum cost of correction" (hereinafter "MinCorr" where appropriate) problem.

Figure 1:
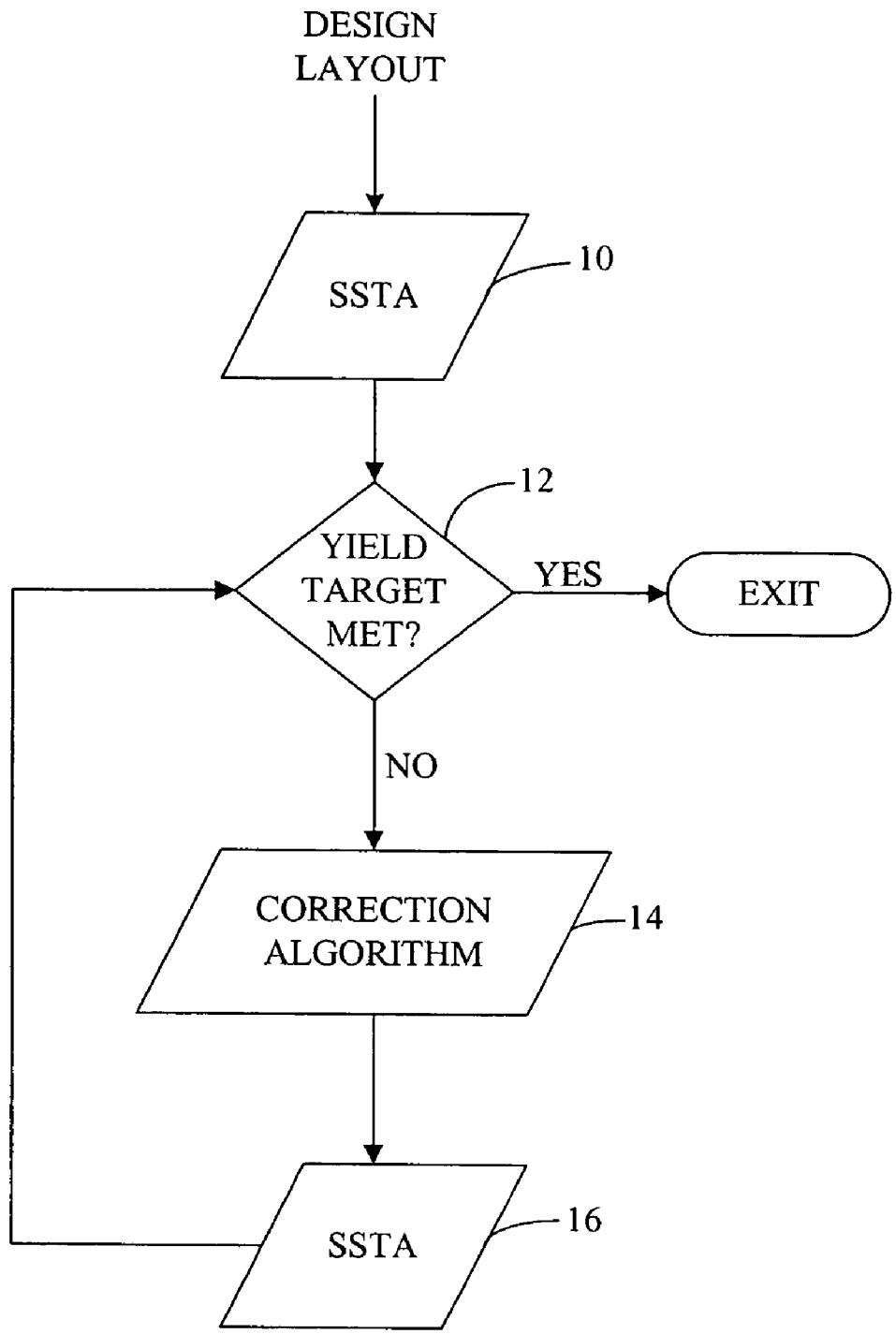
FIG. 1 is a flowchart describing the method for determining the level of correction of mask features in accordance with one embodiment of the invention.

In accordance with one embodiment of the invention, FIG. 1 describes a method for determining the level of correction for each feature such that a prescribed selling point delay is attained with minimum total correction cost. Given a mask design layout that meets performance constraints (after logic synthesis, placement and routing processes have been completed, as is known in conventional design flow), a statistical static timing analysis (SSTA) is performed to output the probability density function (PDF) of circuit performance, for example, the arrival time at all nodes in the circuit, given deterministic arrival times at the primary inputs (PIs) of the mask design layout (block 10). Circuit performance may also be described in terms of power and leakage through, for example. The SSTA is a timing analysis wherein probability distributions of the arrival times are propagated from inputs to outputs instead of deterministic arrival times as in static timing analysis (STA). Those skilled in the art will recognize that STA is a circuit timing analysis methodology which propagates worst-case arrival times of signals from inputs to output statically, i.e., without any circuit simulation.

If the target yield has been met (block 12), then the mask design layout does not require any correction, and the process ends at this point. For example, a target yield is met if a predetermined percentage, e.g., 99%, of parts of the design layout run at the target frequency or higher as determined based on the SSTA. Whether the target yield has been met is based on yield-aware performance library models (described in more in detail below) which capture delay mean, variance and the relative cost of RET for each level of correction for each library master. On the other hand, if the target yield has not been met (block 12), the most yield critical features, (i.e., the features which the maximum impact on circuit yield among all features on the design layout) are corrected using a RET such as OPC based on a correction algorithm (described in more detail below) (block 14), and the corrected mask design layout undergoes another SSTA (block 16). After the SSTA has been performed, it is again determined whether the corrected mask design layout has met the target yield (block 12).

Figure 2A:
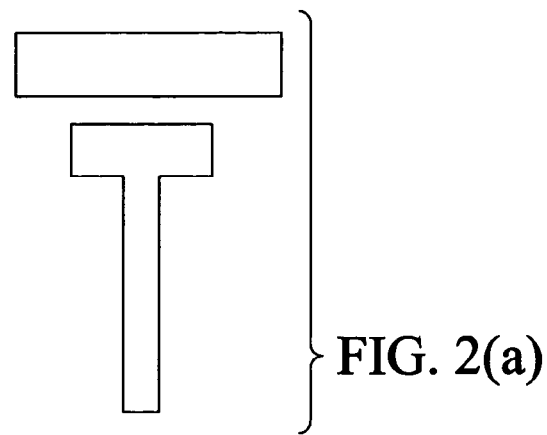
FIGS. 2(*a*) to 2(*c*) are diagrams showing a mask feature with different levels of correction.
Figure 2B:
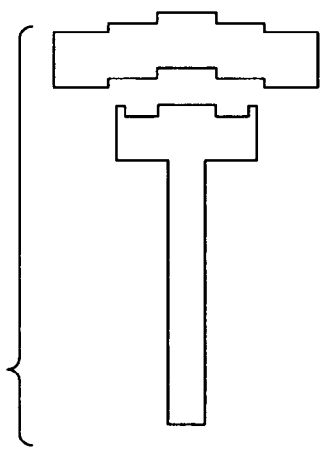
Figure 2C:
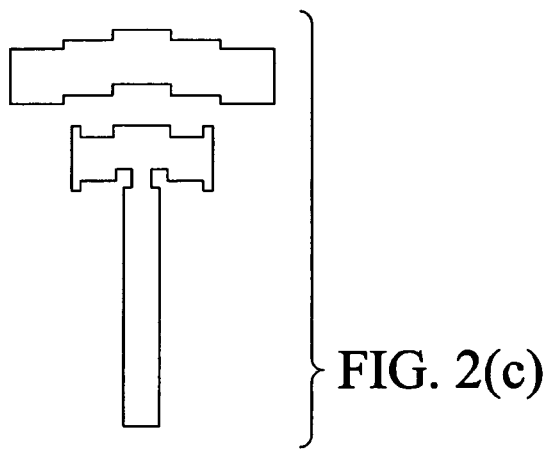

If the target yield has now been met (block 12), then the design layout does not require any further correction, and the process ends at this point. On the other hand, if the target yield has not been met (block 12), the design layout goes through another correction process as described above. These steps, as described in blocks 12, 14 and 16, are repeated iteratively until the target yield is met for the entire design layout. FIGS. 2(*a*)–2(*c*) shows examples of a printed feature with no correction, moderate level of correction and aggressive level of correction, respectively.

It should be understood that one embodiment of the invention assumes that different levels of RET can be independently applied to any gate in the design, i.e., any logic components of any digital design. The granularity at which different levels of RET can be applied within the design may be at the individual feature or transistor level, at the gate level, at the standard-cell level, or even at higher levels. The description of the invention is focused on the gate level for purposes of illustration. Corresponding to each level of correction, there is an effective channel length (Leff) variation and an associated cost. It is also assumed that variation-aware performance library models are available for each level of correction.

In the above description with respect to the flowchart of FIG. 1, a target selling point delay is assumed to be given by a user input. Given the delay mean and standard deviation at every circuit node, the SSTA computes the yield point at each primary output. Thus, we can calculate a slack value or σ-slack, which is the slack available in yield, i.e., (target yield—calculated yield), at all primary outputs. One embodiment of the invention enables the correction or decorrection of printed features (e.g., gates) to minimize the cost of RET while still meeting the σ-slack constraints. Correction of printed features generally increases the mask correction while decorrection decreases mask cost.

The correction algorithm discussed above with respect to block 14 in FIG. 1 is now described according to one embodiment of the invention. To reduce the algorithmic complexity, we assume that the standard deviations of the gate-delays are additive, i.e., we assume a perfect positive correlation between gate-delay variations along any path. If we assume that the path delay distributions remain Gaussian, then we can propagate the predetermined yield point (99% (i.e., $\mu+3\sigma$), for example) to the primary output. More specifically, we assume that $$\mu+k\sigma=\mu_1+k\sigma_1+\mu_2+k\sigma_2 \quad (1)$$

where $\mu$ is the mean, $\sigma$ is the standard deviation of the performance distribution of gates, and $\mu+k\sigma$ denotes a certain level of parametric yield. This also enables us to use STA instead of SSTA to verify the σ-slack correctness of the circuit.

Thus, in accordance with one embodiment of the invention, we can formulate the decorrection problem as a mathematical programming problem as follows.

Minimize $\Sigma_{i,j} x_{ij}$ \quad (2)

$\Sigma_j x_{ij} = 1$ $\Sigma_j x_{ij} d_{ij} + wd_i < wd_k \forall k \in \text{fanout}(i)$ $wd_k = U \forall k \in PO$ $x_{ij} \in \{0,1\}$ where, $d_{ij} = \mu+k\sigma$ number for gate i corresponding to level of correction j, $c_{ij}=$ cost of correction number for gate i corresponding to level of correction j, $x_{ij} = 1$ if gate i is corrected to level j, $wd_i=$ worst case it $\mu+k\sigma$ delay at input of gate i, calculated using STA, and $U=\mu+k\sigma$ delay upper bound at the primary outputs (POs).

The above integer program requires running the STA tool incrementally to update $wd_i$ every time any $x_{ij}$ is updated. In this manner, the integer program, i.e., the correction algorithm, provides the level of correction for each printed feature. The design layout is physically corrected based on these calculated levels of correction. In one embodiment, the STA is built into a computer program for running the integer program. The integer program may also be programmed to run directly on the STA.

It should be noted that the results we obtain from solving the program are strictly pessimistic if the circuit consists of perfectly correlated paths. This is because gates would always be somewhat less than perfectly correlated, in which case the standard deviation of the sum would be less than the sum of standard deviations. However, in practice, a circuit contains many partially correlated or independent paths. In this case, calculating the delay distribution at any primary output (PO) requires computing the maximum of the delay distributions of all the paths fanning out to the PO. The resultant Max distribution may not remain Gaussian and is likely to have larger mean and smaller variance than the parent distributions.

To account for this, one embodiment of the invention again runs SSTA on the decorrected circuit and computes σ-slacks at all POs (block 16, shown in FIG. 1). We then fix the negative slack (i.e., the calculated yield is less than target yield) at any PO by correcting the large-fanout nodes at the last few levels (close to the leaves) in the fanin cone of the PO. We distribute the positive slack (i.e., the calculated yield is larger than target yield) among the small-fanout nodes in the first few levels of the fanin cone of the PO. This is done iteratively until (σ-slacks at all POs become sufficiently close to zero.

In accordance with another embodiment of the invention, the correction algorithm discussed above with respect to block 14 of FIG. 1 is obtained by drawing parallels between the MinCorr problem (i.e., the problem of determining the level of correction for each feature) and the known gate sizing and delay budgeting problems. One analogy is that allowed "sizes" in the minimum cost of correction problem correspond to the allowed levels of correction. For each instance in the design, there is a cost and delay σ associated with every level of correction. Mapping between gate sizing and minimum cost of correction problem is depicted in FIG. 3, and is correct to the extent of assuming additivity as in Equation (1). It should be noted that Equation (1) need not be assumed if a correction (sizing) tool (not shown) is driven by SSTA rather than STA.

Given FIG. 3, we can construct yield libraries in a similar fashion as timing libraries. This enables us to use the yield (timing) libraries with a commercial synthesis tool such as Synopsys Design Compiler (DC) to recorrect (resize) the design layout to meet the yield (delay) target with the minimum cost (area). A timing library, which is a known, gives the area and delay of each cell master. A synthesis or sizing tool uses this timing library to choose sizes of all cells or gates in the design layout with the objective of minimizing cycle time and/or total area. In one embodiment of the invention, we replace the standard timing library with a yield library with the transformation given in FIG. 3. Use of a commercial tool enables us to make many optimizations in practical runtimes. Examples include minimizing the cost of correction given the selling point delay, and minimizing the selling point delay given an upper bound on the cost of RET, for example, OPC.

In accordance with one embodiment, a new worst case timing model is generated by using Monte-Carlo (MC) simulation, or using a deterministic corner-based approximation. MC simulations assume that every parameter (oxide thickness ($T_{ox}$), channel doping ($N_{ch}$), channel length, etc.) varies simultaneously in a normally distributed fashion, and consequently provide the best accuracy at the cost of large runtime. Corner-based simulations use a single value for each parameter to find a single worst-case delay.

The yield-aware library also captures the relative cost of RET at each level of correction for each master. Correction cost information is included in the newly generated yield library files using the cell area attribute. Our metric for cost is given by relative figure count multiplied by the number of transistors in each cell. We use this weighted cost function to capture: (1) the cost differences across the three libraries with different levels of correction applied, and (2) the relative difference in cost of correcting cells with different sizes/complexities. We do not simply use the initial area as a weighting factor as we want to emphasize the correction of actual devices rather than field regions which may dominate the cell area. Another option is to weight the figure count by the total transistor perimeter in a cell. Figure count is found to be consistent across cell types, as would be expected from a standard-cell library that has limited diversity in the arrangements of devices within the cell.

As stated above, once the yield library is constructed, a commercial synthesis tool such as Synopsys Design Compiler (DC) is used to solve the minimum cost of correction (MinCorr) problem. Specifically, we input a yield library in which identical cells in the original timing library show up as three "sized" versions with same cell function but different "areas" and "timing". We then use DC to perform gate-resizing on the synthesized netlist with a selling point delay constraint given as the maximum circuit delay constraint.

In accordance with another embodiment of the invention, instead of having discrete levels of correction (medium, aggressive, etc.) for the layout geometries, exact variation tolerances are computed independently for each layout feature. In other words, the level of correction can be extended to be more quantitative. Given the parametric yield constraint on a performance metric for the circuit, tolerable performance variation can be calculated for the layout features by using any known performance budgeting algorithm.

This performance variation tolerance is then translated to CD variation tolerance. CD variation tolerance is the maximum deviation from nominal CD, which refers to gate length that determines performance, that still meets performance variation constraints previously calculated. The dependence of performance metrics such as delay and power on gate length (i.e. CD) is known in the art. Given the value of the performance metric, corresponding CD for the gate can be calculated by one of ordinary skill in the art.

As a result, we have CD tolerance for every feature in the layout. CD is determined by two edges of a feature (i.e., gate). As is known, gates are rectangles of polysilicon. CD or gate length refers to the width of these rectangles which is determined by left and right edges of the rectangle. Commercial OPC tools, for example, work to obtain correct printing of these edges. We translate the CD variation tolerance to two Edge Placement Error (EPE) tolerances (left and right) for every layout feature. One translation method, for example, may include fixing the EPC for each of the edges at 5 nm, If CD variation tolerance is 10 nm. These EPE tolerances are then enforced using a commercial RET tool. With a minimum correction objective, the maximum performance variation tolerance and hence maximum EPE for each layout feature is calculated without losing parametric yield. The RET tool enforces this varying tolerance across the layout resulting in a minimum cost mask.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for performing a mask design layout resolution enhancement, comprising:
   determining a first level of correction for the mask design layout for a predetermined parametric yield with a minimum total correction cost; and
   correcting the mask design layout at said first level of correction based on a correction algorithm if said first level of correction is determined to be required;
   wherein said determining a first level of correction includes obtaining a probability density function of circuit performance of the mask design layout.

2. The method as defined in claim 1 wherein said probability density function is obtained using a statistical static timing analysis (SSTA).

3. The method as defined in claim 2 wherein said probability density function is compared with said predetermined parametric yield with said minimum total correction cost to determine said first level of correction.

4. The method as defined in claim 3 wherein the mask design layout is not corrected if it is determined that said first level of correction is not required.

5. The method as defined in claim 1 further including determining a second level of correction for the mask design layout for said predetermined parametric yield after correcting the mask at said first determined level of correction.

6. The method as defined in claim 5 further including correcting the mask design layout at said second level of correction based on said correction algorithm if said second level of correction is determined to be required.

7. The method as defined in claim 6 wherein the mask design layout is not corrected if it is determined that said second level of correction is not required.

8. The method as defined in claim 1 wherein said correction algorithm is based on an assumption that standard deviations of gate delays of the mask design layout are additive.

9. The method as defined in claim 8 wherein said correction algorithm is based on an assumption that $$\mu+k\sigma=\mu_1+k\sigma_1+\mu_2+k\sigma_2$$

where $\mu_i$ is a mean, $\sigma_i$ is a standard deviation of the performance distribution of gates, and $\mu_i+k\sigma_i$ denotes a certain level of parametric yield, for all i =1, 2.

10. The method as defined in claim 9 wherein said correction algorithm is a mathematical programming problem expressed as, Minimize $\Sigma_{i,j} x_{ij}$ $\Sigma_j x_{ij}=1$ $\Sigma_j x_{ij} d_{ij} + wd_i < wd_k \forall k \in \text{fanout}(i)$ $wd_k = U \forall k \in PO$ $x_{ij} \in \{0,1\}$ where,
$d_{ij}=\mu+k\sigma$ number for gate i corresponding to level of correction j,
$c_{ij}$=cost of correction number for gate i corresponding to level of correction j,
$x_{ij}$=1 if gate i is corrected to level j,
$wd_i$=worst case $\mu+k\sigma$ delay at input of gate i, calculated using STA,
$U=\mu+k\sigma$ delay upper bound at the primary outputs (POS).

11. The method as defined in claim 9 wherein said correction algorithm is obtained by mapping to an area, a nominal delay, a cycle time and a die area of a gate sizing problem.

12. The method as defined in claim 11 wherein said correction algorithm is obtained by mapping an area, a nominal delay, a cycle time and a die area of said gate sizing problem with a cost of correction, delay $\mu+k\sigma$, selling point delay and total cost of resolution enhancement technique (RET), respectively.

13. The method as defined in claim 12 wherein a yield library having said predetermined parametric yield is constructed to have a form of a timing library.

14. The method as defined in claim 1 wherein said predetermined parametric yield is obtained from a yield library, wherein said yield library captures delay mean and variance for each level of correction for each library master, and a relative cost of resolution enhancement technique (RET) at each level of correction for said each master.

15. A method for minimizing a cost of correction of a mask design layout, comprising:
obtaining a first probability density function of a signal arrival time at an output of a circuit on the mask design layout;
determining whether said first probability density function satisfies a predetermined parametric yield with a minimum total correction cost; and
correcting the mask design layout at a first level of correction based on a correction algorithm if said first probability density function does not satisfy said predetermined parametric yield with said minimum total correction cost.

16. The method as defined in claim 15 wherein said first probability density function is obtained using a statistical static timing analysis (SSTA).

17. The method as defined in claim 15 wherein the mask design layout is not corrected if said first probability density function satisfies said predetermined parametric yield with said minimum total correction cost.

18. The method as defined in claim 15 further including:
determining a second probability density function of an arrival time at the output of the circuit on the mask design layout after correcting the mask design layout at said first level of correction; and
determining whether said second probability density function satisfies said predetermined parametric yield with said minimum total correction cost; and
correcting the mask design layout at a second level of correction based on said correction algorithm if said second probability density function does not satisfy said predetermined parametric yield with said minimum total correction cost, and not correcting the mask design layout if said second probability density function satisfies said predetermined parametric yield with said minimum total correction cost.

19. The method as defined in claim 15 wherein said correction algorithm is based on an assumption that standard deviations of gate delays of the mask design layout are additive.

20. The method as defined in claim 19 wherein said correction algorithm is based on an assumption that $$\mu+k\sigma=\mu_1+k\sigma_1+\mu_2+k\sigma_2$$

where $\mu_i$ is a mean, $\sigma_i$ is a standard deviation of the performance distribution of gates, and $\mu_i+k\sigma_i$ denotes a level of parametric yield, for all i=1, 2.

21. The method as defined in claim 20 wherein said correction algorithm is a mathematical programming problem expressed as, Minimize $\Sigma_{i,j} x_{ij}$ $\Sigma_j x_{ij}=1$ $\Sigma_j x_{ij} d_{ij} + wd_i < wd_k \forall k \in \text{fanout}(i)$ $wd_k = U \forall k \in PO$ $x_{ij} \in \{0,1\}$ where,
$d_{ij}=\mu+k\sigma$ number for gate i corresponding to level of correction j,
$c_{ij}$=cost of correction number for gate i corresponding to level of correction j,
$x_{ij}$=1 if gate i is corrected to level j,
$wd_i$=worst case $\mu+k\sigma$ delay at input of gate i, calculated using STA, and
$U=\mu+k\sigma$ delay upper bound at the primary outputs (POs).

22. The method as defined in claim 20 wherein said correction algorithm is obtained by mapping to an area, a nominal delay, a cycle time and a die area of a gate sizing problem.

23. The method as defined in claim 22 wherein said correction algorithm is obtained by mapping an area, nominal delay, cycle time and die area of the gate sizing problem with a cost of correction, delay $\mu+k\sigma$, selling point delay and total cost of resolution enhancement technique (RET), respectively.

24. The method as defined in claim 23 wherein a yield library having said predetermined parametric yield is constructed to have a form of a timing library.

25. The method as defined in claim 15 wherein said predetermined parametric yield is obtained from a yield library which captures performance mean and variance for each level of correction for each library master, and a relative cost of resolution enhancement technique (RET) at each level of correction for said each master.

26. A method for performing a mask design layout resolution enhancement comprising:
    determining a tolerable performance variation for each of a plurality of features in the mask design layout;
    determining a critical dimension (CD) variation tolerance corresponding to said tolerable performance variation for each of said plurality of features;
    determining an edge placement error (EPE) tolerance corresponding to said CD variation tolerance for said each of said plurality of features; and
    correcting each of said plurality of features so that at least one edge on said each of said plurality of features prints within a tolerance based on said EPE tolerance.

27. The method as defined in claim 26, wherein said tolerable performance variation for each of said plurality of features is determined using a performance budgeting algorithm.

28. The method as defined in claim 26, wherein said critical dimension (CD) variation tolerance is determined from said tolerable performance variation using dependences of performance on critical dimension (CD).

29. The method as defined in claim 26, wherein said at least one edge on said each of said plurality of features is corrected by implementing a resolution enhancement technique (RET) based on said EPE tolerance.

30. A machine readable medium for storing a program in a system for performing a mask design layout resolution enhancement in which a level of correction for a mask design layout for a predetermined parametric yield with a minimum total correction cost is determined, and the mask design layout is corrected at a determined level of correction based on the program if the level of correction is determined to be required, said program comprising:
    a mathematical program expressed as, Minimize $\Sigma_{i,j} x_{ij}$ $\Sigma_j x_{ij} = 1$ $\Sigma_j x_{ij} d_{ij} + wd_i < wd_k \forall k \in \text{fanout}(i)$ $wd_k = U \forall k \in PO$ $x_{ij} \in \{0,1\}$ where,
    $d_{ij} = \mu + k\sigma$ number for gate i corresponding to level of correction j,
    $c_{ij}$ = cost of correction number for gate i corresponding to level of correction j,
    $x_{ij} = 1$ if gate i is corrected to level j,
    $wd_i$ = worst case $\mu + k\sigma$ delay at input of gate i, calculated using STA, and
    $U = \mu + k\sigma$ delay upper bound at the primary outputs (POs).

31. The medium as defined in claim 30 wherein said correction algorithm is based on an assumption that $\mu + k\sigma = \mu_1 + k\sigma_1 + \mu_2 + k\sigma_2$ where $\mu_i$ is a mean, $\sigma_i$ is a standard deviation of the performance distribution of gates, and $\mu_i + k\sigma_i$ denotes a certain level of parametric yield, for all i=1, 2.

32. A machine readable medium for storing a program in a system for performing a mask design layout resolution enhancement in which a level of correction for the mask design layout for a predetermined parametric yield with a minimum total correction cost is determined, and the mask design layout is corrected at the determined level of correction based on the program if the level of correction is determined to be required, said program comprising:
    mapping at least an area, a nominal delay, a cycle time and a die area of a gate sizing problem with a cost of correction, delay $\mu + k\sigma$, selling point delay and total cost of resolution enhancement technique (RET), respectively; and
    creating a yield library from said mapping.

33. A system for minimizing a cost of correction of a mask design layout, comprising:
    analyzing means for obtaining a first probability density function of a signal arrival time at an output of a circuit on the mask design layout; and
    correction means for determining a first level of correction of the mask design layout based on a correction algorithm if said first probability density function does not satisfy a predetermined parametric yield with a minimum total correction cost.

34. The system as defined in claim 33 wherein said analyzing means is a statistical static timing analysis (SSTA).

35. The system as defined in claim 33 wherein said correction algorithm is provided on a machine readable medium and includes a mathematical programming problem expressed as, Minimize $\Sigma_{i,j} x_{ij}$ $\Sigma_j x_{ij} = 1$ $\Sigma_j x_{ij} d_{ij} + wd_i < wd_k \forall k \in \text{fanout}(i)$ $wd_k = U \forall k \in PO$ $x_{ij} \in \{0,1\}$ where,
    $d_{ij} = \mu + k\sigma$ number for gate i corresponding to level of correction j,
    $c_{ij}$ = cost of correction number for gate i corresponding to level of correction j,
    $x_{ij} = 1$ if gate i is corrected to level j,
    $wd_i$ = worst case $\mu + k\sigma$ delay at input of gate i, calculated using STA, and
    $U = \mu + k\sigma$ delay upper bound at the primary outputs (POs).

36. The system as defined in claim 35 wherein said correction algorithm is based on an assumption that $\mu + k\sigma = \mu_1 + k\sigma_1 + \mu_2 + k\sigma_2$ where $\mu_i$ is a mean, $\sigma_i$ is a standard deviation of the performance distribution of gates, and $\mu_i + k\sigma_i$ denotes a level of parametric yield, for all i=1, 2.

37. The system as defined in claim 33 wherein said correction algorithm is provided on a machine readable medium and stores a program for,
    mapping at least an area, a nominal delay, a cycle time and a die area of a gate sizing problem with a cost of correction, delay $\mu + k\sigma$, selling point delay and total cost of resolution enhancement technique (RET), respectively; and
    creating a yield library from said mapping.

* * * * *

UNITED STATES PATENT AND TRADEMARK OFFICE
CERTIFICATE OF CORRECTION

PATENT NO. : 7,149,999 B2 Page 1 of 1
APPLICATION NO. : 10/787070
DATED : December 12, 2006
INVENTOR(S) : Andrew B.Kahng It is certified that error appears in the above-identified patent and that said Letters Patent is hereby corrected as shown below:

In the Issued Patent:

Column 4, line 17, after "worst case" please delete "it".

Column 7, line 32, after "outputs" please delete "(POS)", and insert --(POs)-- therefor.

Signed and Sealed this

Seventh Day of August, 2007

JON W. DUDAS
*Director of the United States Patent and Trademark Office*